(12) United States Patent
Yamamoto

(10) Patent No.: US 11,862,661 B2
(45) Date of Patent: Jan. 2, 2024

(54) MANUFACTURING METHOD OF IMAGE PICKUP APPARATUS, AND IMAGE PICKUP APPARATUS

(71) Applicant: OLYMPUS CORPORATION, Tokyo (JP)

(72) Inventor: Ken Yamamoto, Nagano (JP)

(73) Assignee: OLYMPUS CORPORATION, Tokyo (JP)

( * ) Notice: Subject to any disclaimer, the term of this patent is extended or adjusted under 35 U.S.C. 154(b) by 415 days.

(21) Appl. No.: 17/341,892

(22) Filed: Jun. 8, 2021

(65) Prior Publication Data

US 2021/0313386 A1 Oct. 7, 2021

Related U.S. Application Data

(63) Continuation of application No. PCT/JP2018/045285, filed on Dec. 10, 2018.

(51) Int. Cl.
*H01L 27/146* (2006.01)
*H01L 21/66* (2006.01)

(52) U.S. Cl.
CPC ........ *H01L 27/14685* (2013.01); *H01L 22/12* (2013.01)

(58) Field of Classification Search
CPC ............................ H01L 27/14685; H01L 22/12
See application file for complete search history.

(56) References Cited

U.S. PATENT DOCUMENTS

| 2003/0137595 | A1 | 7/2003 | Takachi | |
|---|---|---|---|---|
| 2007/0166029 | A1* | 7/2007 | Lee | H01L 27/14627 396/529 |
| 2011/0181854 | A1* | 7/2011 | Ovrutsky | G03B 17/02 355/55 |

(Continued)

FOREIGN PATENT DOCUMENTS

| JP | H09-097889 A | 4/1997 |
|---|---|---|
| JP | H10-321827 A | 12/1998 |

(Continued)

OTHER PUBLICATIONS

International Search Report dated Apr. 9, 2019 issued in PCT/JP2018/045285.

*Primary Examiner* — Peniel M Gumedzoe
(74) *Attorney, Agent, or Firm* — Scully, Scott, Murphy & Presser, P.C.

(57) ABSTRACT

A manufacturing method of an image pickup apparatus includes: fabricating a plurality of image pickup members each having a light-receiving surface on which a transparent plate is disposed and a plurality of spacers; measuring thicknesses of the transparent plates and the spacers; classifying the image pickup members into first groups depending on the thicknesses of the transparent plates; classifying the spacers into second groups depending on the thicknesses, selecting a combination of any one of the first groups and any one of the second groups such that a sum of the thickness of each of the transparent plates and the thickness of each of the spacers is within a predetermined range with a focusing length of optical members as a center; fabricating stacked bodies by stacking the image pickup members and the spacers in the selected combination; and disposing the optical members on the spacers in the stacked bodies.

5 Claims, 8 Drawing Sheets

(56) References Cited

U.S. PATENT DOCUMENTS

2018/0348415 A1   12/2018   Sasaki et al.

FOREIGN PATENT DOCUMENTS

| JP | 2007-097192 A | 4/2007 |
| JP | 2007-195167 A | 8/2007 |
| JP | 2009-147092 A | 7/2009 |
| JP | 2010-181643 A | 8/2010 |
| JP | 2012-018993 A | 1/2012 |
| WO | 2010/074743 A1 | 7/2010 |
| WO | 2017/094537 A1 | 6/2017 |

* cited by examiner

MANUFACTURING METHOD OF IMAGE PICKUP APPARATUS, AND IMAGE PICKUP APPARATUS

CROSS-REFERENCE TO RELATED APPLICATION

This application is a continuation application of PCT/JP2018/045285 filed on Dec. 10, 2018, the entire contents of which are incorporated herein by this reference.

BACKGROUND OF THE INVENTION

1. Field of the Invention

The present invention relates to a manufacturing method of an image pickup apparatus in which an optical member, a spacer, and an image pickup member are stacked, the optical member including a plurality of stacked optical elements, the image pickup member including a transparent plate and an image pickup device.

2. Description of the Related Art

An image pickup member of an image pickup apparatus includes an image pickup device including, on a light-receiving surface thereof, a cover glass that protects a light-receiving region. The image pickup member converts an image of an object, which is condensed on the light-receiving surface of the image pickup device by the optical member, into an electric signal.

A spacer is disposed between an optical member and a cover glass. The spacer is used not only for making an optical path length longer but also for adjusting the optical path length. In other words, the thickness of the cover glass is not fixed. In order to obtain an image pickup apparatus with excellent optical characteristics, it has been necessary to dispose a spacer having a thickness corresponding to the thickness of the cover glass. To this end, a spacer is selected based on a sum of the thickness of the spacer and the thickness of the cover glass.

Japanese Patent Application Laid-Open Publication No. 2012-18993 discloses an optical member constituted of a wafer-level stacked body as a method of effectively manufacturing an optical member. Wafer-level optical members are manufactured by cutting a stacked optical wafer in which a plurality of optical wafers, each including a plurality of optical elements, are stacked. There is a case where the wafer-level optical members have different optical path lengths (focal lengths) for each stacked wafer.

SUMMARY OF THE INVENTION

A manufacturing method of an image pickup apparatus according to an embodiment of the present invention includes: fabricating a plurality of image pickup members each including a light-receiving surface on which a transparent plate is disposed, and a plurality of spacers each configured to adjust an optical path length; measuring a thickness of each of the transparent plates and a thickness of each of the plurality of spacers; classifying the plurality of image pickup members into a plurality of first groups depending on the thickness of each of the transparent plates; classifying the plurality of spacers into a plurality of second groups depending on the thickness of each of the spacers; selecting a combination of any one of the plurality of first groups and any one of the plurality of second groups such that a sum of the thickness of each of the transparent plates and the thickness of each of the spacers is within a predetermined range with a focusing length of optical members as a center, the optical members each comprising an incident surface, an emission surface opposed to the incident surface, and a plurality of stacked optical elements, the focusing length being a length from the emission surface to a focusing surface of each of the optical members; fabricating stacked bodies, each of the stacked bodies being fabricated by stacking the image pickup member in the first group and the spacer in the second group in the selected combination; and disposing the optical members respectively on the spacers in the stacked bodies.

An image pickup apparatus according to the embodiment of the present invention is manufactured by a manufacturing method that includes: fabricating a plurality of image pickup members each including a light-receiving surface on which a transparent plate is disposed, and a plurality of spacers each configured to adjust an optical path length; measuring a thickness of each of the transparent plates and a thickness of each of the plurality of spacers; classifying the plurality of image pickup members into a plurality of first groups depending on the thickness of each of the transparent plates; classifying the plurality of spacers into a plurality of second groups depending on the thickness of each of the spacers; selecting a combination of any one of the plurality of first groups and any one of the plurality of second groups such that a sum of the thickness of each of the transparent plates and the thickness of each of the spacers is within a predetermined range with a focusing length of optical members as a center, the optical members each comprising an incident surface, an emission surface opposed to the incident surface, and a plurality of stacked optical elements, the focusing length being a length from the emission surface to a focusing surface of each of the optical members; fabricating stacked bodies, each of the stacked bodies being fabricated by stacking the image pickup member in the first group and the spacer in the second group in the selected combination; and disposing the optical members respectively on the spacers in the stacked bodies.

DETAILED DESCRIPTION OF THE PREFERRED EMBODIMENT(S)

First Embodiment

Figure 1:
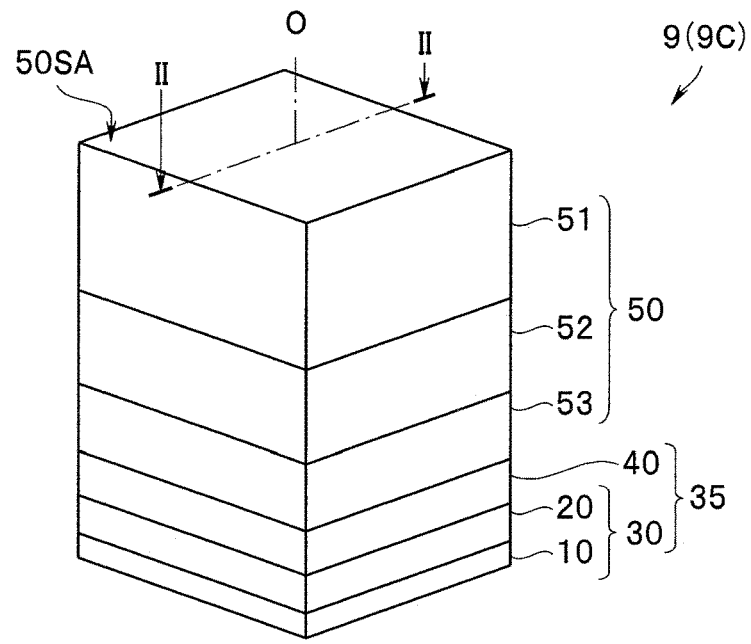
FIG. 1 is a perspective view of an image pickup apparatus according to a first embodiment.
Figure 2:
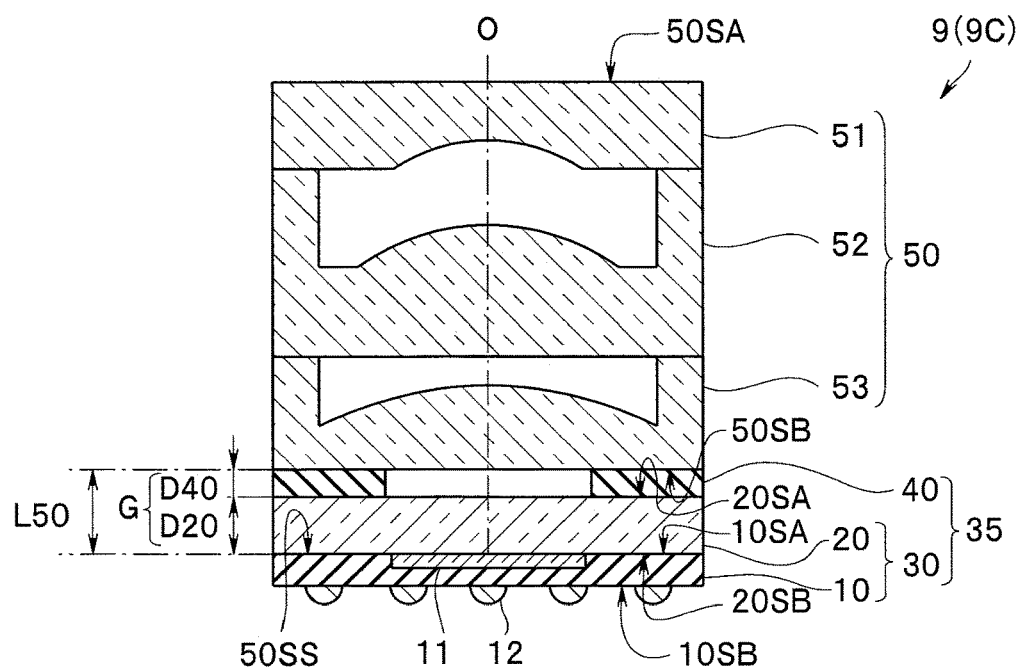
FIG. 2 is a sectional view of the image pickup apparatus according to the first embodiment, which is taken along the line II-II in FIG. 1.

As illustrated in FIG. 1 and FIG. 2, an image pickup apparatus 9 according to the present embodiment includes an image pickup member 30, a spacer 40, and an optical member 50.

Note that drawings based on each of embodiments are schematic in the description below. The relationship between thicknesses and widths of respective parts, a ratio of the thickness, the relative angle, and the like of a certain part to those of another part are different from the actual ones. The respective drawings include parts in which the relationships and ratios among the dimensions are different. In addition, illustration of some of constituent elements and impartment of reference numerals to some of the constituent elements are omitted.

The image pickup member 30 includes an image pickup device 10 and a cover glass 20. The image pickup device 10 includes a light-receiving surface 10SA and a rear surface 10SB opposed to the light-receiving surface. The light-receiving surface 10SA includes a light-receiving region 11 configured of a CCD or a CMOS light-receiving circuit. On the rear surface 10SB, external electrodes 12 connected to the light-receiving region 11 are disposed. The image pickup device 10 may be a front surface irradiation type image sensor or a rear surface irradiation type image sensor. On the light-receiving surface 10SA, the cover glass 20 is disposed by using a transparent adhesive (not illustrated). The cover glass 20 is a transparent plate that protects the light-receiving region 11. Note that the transparent plate may be a resin plate made of polycarbonate, or the like.

The spacer 40 for adjusting the optical path length is made of metal, resin, silicon, or the like, having an optical path region formed as a space. The spacer may be a member having a transparent optical path region. The spacer 40 has a picture-frame shape in the cross section orthogonal to an optical axis O, and configured to seal the optical path. However, the spacer may have an L-shape, or a U-shape in the cross section orthogonal to the optical axis O, or may be configured as two parallel walls.

The optical member 50 is fixed to the spacer 40 in a stacked body 35 by using an adhesive (not illustrated), for example. The stacked body 35 is formed by the image pickup member 30 being stacked on the spacer 40.

The optical member 50 includes an incident surface 50SA and an emission surface 50SB opposed to the incident surface 50SA. The optical member 50 is a stacked body in which a first optical element 51, a second optical element 52, and a third optical element 53 are stacked. An image of an object, which is condensed by the optical member 50, is formed on a focusing surface 50SS located at a position separated from the emission surface 50SB by a focusing length L50. The image pickup apparatus 9 configured such that the light-receiving surface 10SA of the image pickup device 10 and the focusing surface 50SS coincide with each other has excellent optical characteristics.

The optical member 50 is a wafer-level optical member fabricated by cutting a stacked wafer. The optical member 50 fabricated from the same stacked wafer has substantially the same focusing length L50. Note that each of the first optical element 51, the second optical element 52, and the third optical element 53 has a rectangular outer shape in the cross section in the direction orthogonal to the optical axis, and has the same outer dimension. The plurality of optical elements 51 to 53 are stacked such that the optical axes O of the optical elements coincide with each other. The configuration of the optical member 50 is an example, and the configuration including the type, the number, and the like of the optical elements is set according to the specification.

As described later, when a plurality of image pickup apparatuses 9 are fabricated, the thicknesses D20 of the respective cover glasses 20 of the plurality of image pickup members 30 are not fixed due to manufacturing errors. The thicknesses D20 of the cover glasses 20 have an error of plus/minus 10%, for example. In other words, when the specification value of the thickness D20 of the cover glasses 20 is 300 μm, the thicknesses D20 of the plurality of cover glasses 20 range from 270 μm to 330 μm.

On the other hand, the thicknesses D40 of the spacers 40 can be set by manufacturing conditions. The thicknesses D40 of the spacers 40 range from 50 μm to 110 μm, for example.

Any one of the plurality of image pickup members 30 and any one of the plurality of spacers 40 are selected such that the sum G of the thickness D20 of the cover glass 20 and the thickness D40 of the spacer 40 has a predetermined specification (plus/minus 20 μm, for example), with the value of the focusing length L50 as a center, and the selected image pickup member and spacer are stacked.

As described later, the manufacturing method of the image pickup apparatus 9 includes classification processes for classifying the image pickup members and the spacers into groups depending on the thicknesses thereof. Therefore, the method enables the image pickup apparatus 9 to be manufactured easily and achieves excellent optical characteristics of the image pickup apparatus 9.

<Manufacturing Method of Image Pickup Apparatus>

Figure 3:
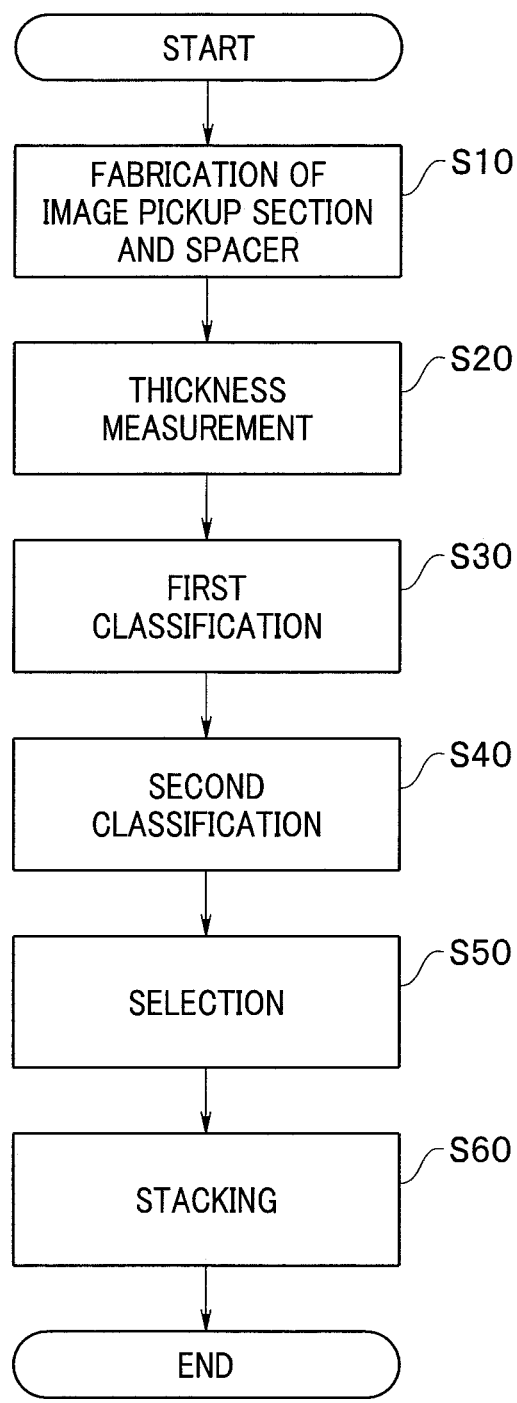
FIG. 3 is a flowchart of a manufacturing method of the image pickup apparatus according to the first embodiment.

Description will be made on the manufacturing method of the image pickup apparatus according to the present embodiment, along the flowchart shown in FIG. 3.

<Step S10> Fabrication Process of Image Pickup Member and Spacer

Although not illustrated, each of the image pickup members 30 is fabricated by cutting a bonded wafer formed by adhering a glass wafer on the light-receiving surface of the image pickup wafer on which a plurality of light-receiving regions 11 and the like are formed. After the glass wafer is adhered, polishing processing of the glass wafer is performed on the bonded wafer. Therefore, according to the polishing conditions, etc., the thickness D20 of the cover glass 20 of each of the image pickup members 30 differs for each bonded wafer.

On the other hand, each of the spacers 40 is fabricated by disposing a metal or a resin on a principal surface of a support plate or by processing a silicon wafer, for example. The thickness of each of the spacers 40 is set according to the fabrication conditions.

Figure 4:
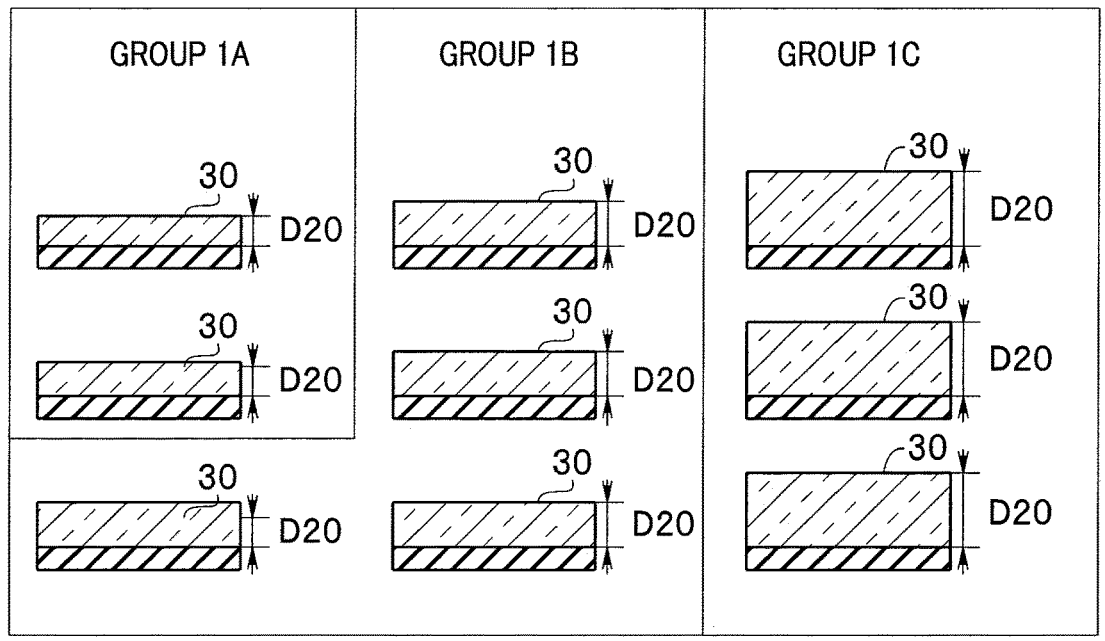
FIG. 4 is a view for explaining a first classification process in the manufacturing method of the image pickup apparatus according to the first embodiment.

Note that the step S10 may be a preparing process of the image pickup members and the spacers. In the preparing process, the image pickup devices 30 and the like, which have been divided into individual pieces, may be purchased.
<Step S20> Thickness Measurement Process The thicknesses D20 of the cover glasses 20 (transparent plates) of the plurality of image pickup members 30 and the thicknesses D40 of the plurality of spacers 40 are measured. It is not necessary to measure the thicknesses of all the image pickup members 30 and the spacers 40. For example, the plurality of image pickup members 30, which are fabricated by dividing the same bonded wafer into individual pieces, have the cover glasses 20 having the same thickness. Therefore, the thickness D20 of at least one cover glass 20 is measured for each bonded wafer. Note that, when the thickness of the image pickup device 10 is fixed and known, the thickness D20 of the cover glass 20 may be calculated by measuring the thickness of the image pickup member 30.
<Step S30> First Classification Process As illustrated in FIG. 4, the plurality of image pickup members 30 are classified into three groups, i.e., first groups 1A, 1B, and 1C, depending on the thicknesses D20 of the cover glasses 20.

The thicknesses D20 of the cover glasses 20 in the first groups 1A, 1B, and 1C are within the following ranges, for example.

Figure 5:
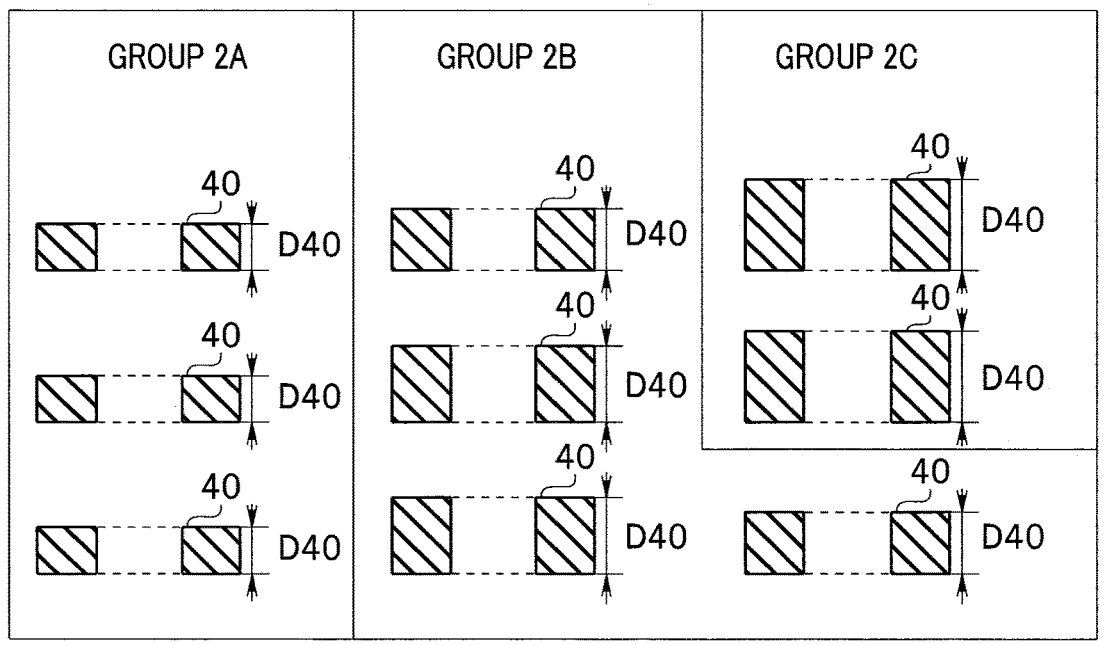
FIG. 5 is a view for explaining a second classification process in the manufacturing method of the image pickup apparatus according to the first embodiment.

The first group 1A; 270 $\mu m \leq D20 < 290$ μm
The first group 1B; 290 $\mu m \leq D20 < 310$ μm
The first group 1C; 310 $\mu m \leq D20 < 330$ μm
<Step S40> Second Classification Process As illustrated in FIG. 5, the plurality of spacers 40 are classified into three groups. i.e., second groups 2A, 2B, and 2C, depending on the thicknesses D40.

The thicknesses D40 of the spacers 40 in the second groups 2A, 2B, and 2C are within the following ranges, for example.

The second group 2A; 50 $\mu m \leq D40 < 70$ μm
The second group 2B; 70 $\mu m \leq D40 < 90$ μm
The second group 2C; 90 $\mu m \leq D40 < 110$ μm Note that the order of the first classification process S30 and the second classification process S40 may be reversed, or the processes may be performed concurrently.
<Step S50> Selection Process A combination of any one of the plurality of first groups 1A to 1C and any one of the plurality of second groups 2A to 2C is selected such that the sum G of the thickness D20 of any one of the cover glasses 20 and the thickness D40 of any one of the spacers 40 is within a predetermined range with the value of the focusing length L50 as a center (for example, plus or minus 20 μm with respect to the focusing length L50 of 380 μm).

One example of the combinations is shown below.
Combination 1: the first group 1A and the second group 2C: 360 $\mu m \leq G < 400$ μm
Combination 2: the first group 1B and the second group 2B: 360 $\mu m \leq G < 400$ μm
Combination 3: the first group 1C and the second group 2A: 360 $\mu m \leq G < 400$ μm
<Step S60> Stack Process (Stacking Process)

The stacked body 35 is fabricated by the image pickup member in the first group and the spacer in the second group in the selected combination being stacked. Furthermore, the optical member 50 is disposed on the spacer 40 in the stacked body 35, to thereby complete the image pickup apparatus 9.

The manufacturing method of the image pickup apparatus 9 includes the first classification process S30 and the second classification process S40, for classifying the image pickup members and the spacers into the groups depending on the thicknesses thereof, which enables the image pickup apparatus 9 to be manufactured easily and achieves the excellent optical characteristics of the image pickup apparatus 9.

Note that the number of groups in the first classification process S30 and the number of groups in the second classification process S40 are preferably 3 or more and 20 or less, although not specifically limited. If the number of groups is 3 or more, it is possible to fabricate the image pickup apparatus 9 with the excellent optical characteristics. If the number of groups is 20 or less, the classifying work is easy. Note that the number of groups in the first classification process S30 may be different from the number of groups in the second classification process S40.

First Modification of First Embodiment

Since an image pickup apparatus 9A and a manufacturing method of the image pickup apparatus 9A according to the present modification are similar to the image pickup apparatus 9 and the manufacturing method of the image pickup apparatus 9, constituent elements having the same functions as those in the image pickup apparatus 9 and the manufacturing method thereof are attached with the same reference numerals and descriptions thereof will be omitted.

Figure 6:
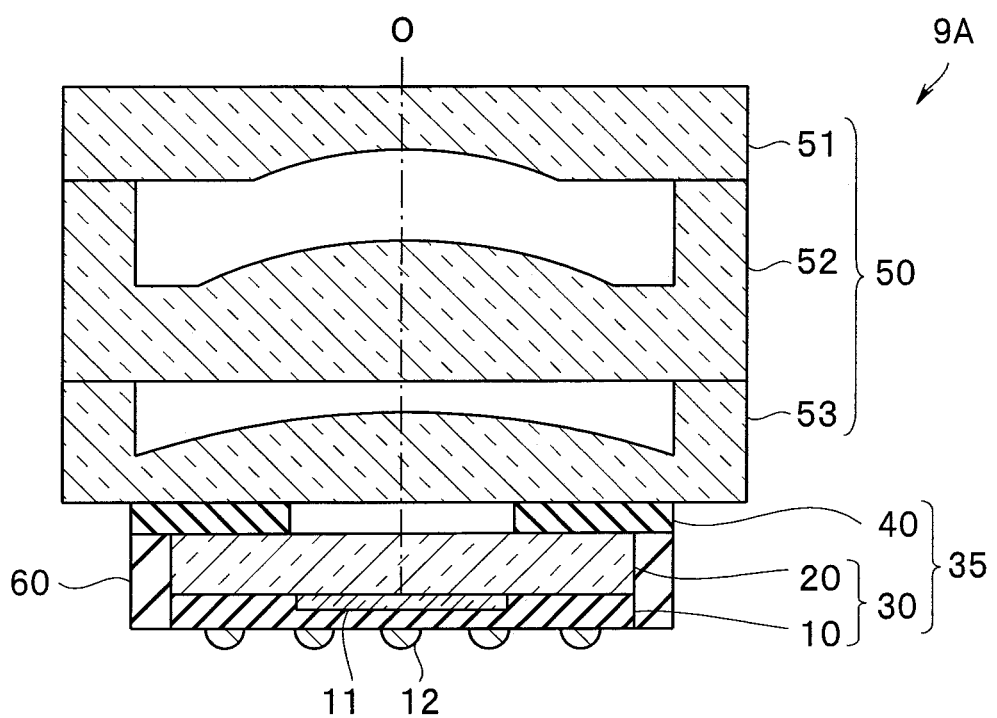
FIG. 6 is a sectional view of an image pickup apparatus according to a first modification of the first embodiment.

As illustrated in FIG. 6, the image pickup apparatus 9A is configured such that the side surfaces of the image pickup member 30 are protected by being covered with a resin 60, to thereby enable easy handling.
<Manufacturing Method of Image Pickup Apparatus 9A>

Figure 7:
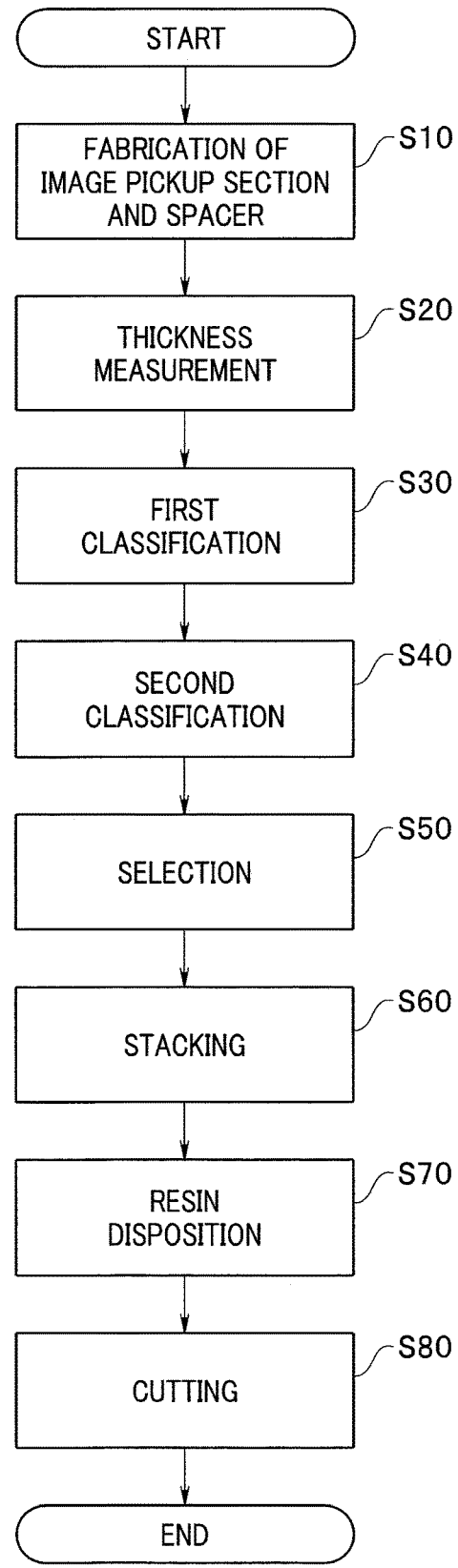
FIG. 7 is a flowchart of a manufacturing method of the image pickup apparatus according to the first modification of the first embodiment.

Description will be made on the manufacturing method of the image pickup apparatus 9A along the flowchart shown in FIG. 7.
<Step S10> Fabrication Process of Image Pickup Member and Spacer The fabrication method of the image pickup member 30 of the image pickup apparatus 9A is the same as that in the manufacturing method of the image pickup apparatus 9.

Figure 8A:
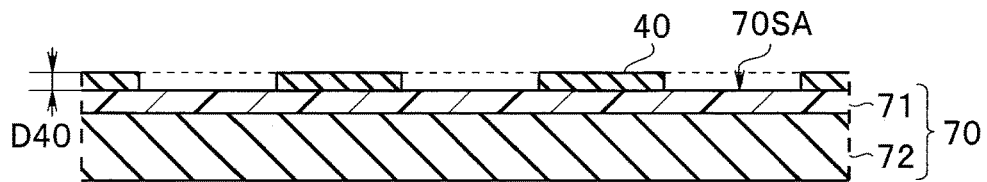
FIG. 8A is a sectional view for explaining the manufacturing method of the image pickup apparatus according to the first modification of the first embodiment.

On the other hand, as illustrated in FIG. 8A, in the image pickup apparatus 9A, the spacer 40 is fabricated on a principal surface 70SA of a support plate 70. For example, the support plate 70 includes a release layer 71 and a base body 72. The release layer 71 loses its adhesive force by being subjected to heating treatment or ultraviolet light irradiation, for example.

The spacer 40 is disposed by molding a resin, patterning a photoresist, forming a plating film, or etching a silicon substrate, etc.

A plurality of spacers 40 having different thicknesses D40 may be disposed on one support plate 70. Alternatively, the spacers 40 may be disposed on each of the support plates 70 such that the thicknesses D40 of the spacers 40 differ for each of the support plates 70.

The step S20 (thickness measurement process), the step S30 (first classification process), the step S40 (second classification process), and the step S50 (selection process) are substantially the same as those in the manufacturing method of the image pickup apparatus 9.

Note that if the plurality of spacers 40 disposed on one support plate 70 are fabricated under the same conditions, the spacers 40 have substantially the same thicknesses D40 in many cases. However, the plurality of spacers 40 having different thicknesses D40 can be disposed on one support plate 70 by changing the fabrication conditions of the plurality of spacers 40 to be disposed on the one support plate 70. In a case where the plurality of spacers 40 are fabricated by forming an electroplating film, for example, the thicknesses D40 of the spacers 40 change depending on a current density distribution. Since the current density is high in the outer peripheral portion of the support plate 70, the spacer 40, the thickness D40 of which is large, is fabricated at the outer peripheral portion. On the other hand, at the center portion of the support plate 70 where the current density is low, the spacer 40, the thickness D40 of which is small, is fabricated.

Alternatively, in the manufacturing method of the image pickup apparatus 9A, a plurality of spacers 40 are disposed on each of the plurality of support plates 70. The spacer disposition conditions are changed for each of the plurality of support plates 70, to thereby fabricate the plurality of spacers 40 having different thicknesses D40 are fabricated. Then, in the step S50 (selection step), for example, an optimal support plate 70 is selected from the plurality of support plates 70.

<Step S60> Stack Process

In the manufacturing method of the image pickup apparatus 9A, in the step S60 (stack process), a plurality of image pickup members 30 of the selected combination are stacked on the plurality of spacers 40 of the selected combination that are disposed on the principal surface 70SA of the support plate 70.

Figure 8B:
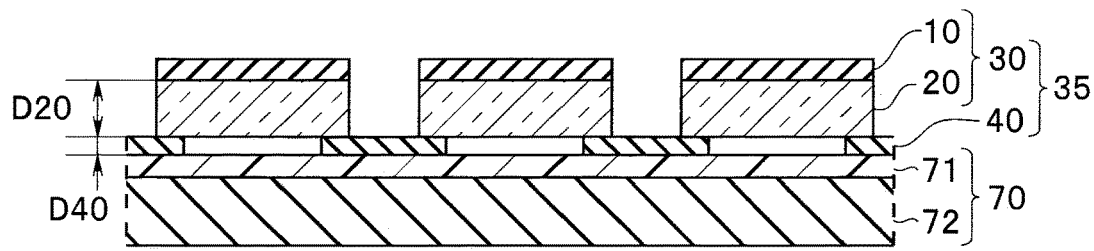
FIG. 8B is a sectional view for explaining the manufacturing method of the image pickup apparatus according to the first modification of the first embodiment.

As illustrated in FIG. 8B, for example, the plurality of image pickup members 30 in the first group 1C are adhered respectively, in a stacked manner, to the plurality of spacers 40 in the second group 2A, and thereby the stacked bodies 35 are fabricated.

<Step S70> Resin Disposition Process

Figure 8C:
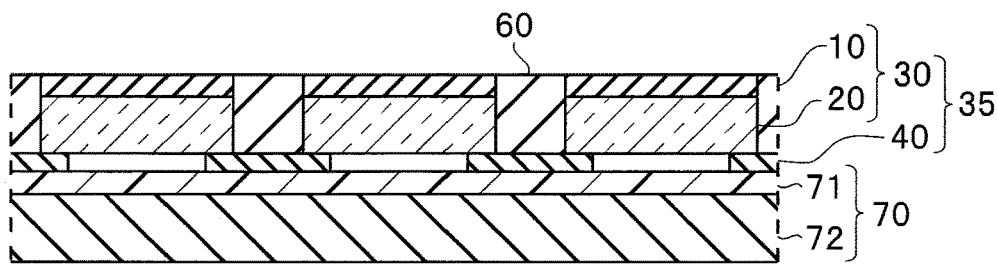
FIG. 8C is a sectional view for explaining the manufacturing method of the image pickup apparatus according to the first modification of the first embodiment.

As illustrated in FIG. 8C, after the stack process S60, the resin 60 is disposed around the plurality of stacked bodies 35 disposed on the principal surface 70SA of the support plate 70. For example, an ultraviolet curable epoxy resin is disposed and ultraviolet light irradiation processing is performed.

<Step S80> Cutting Process

Figure 8D:
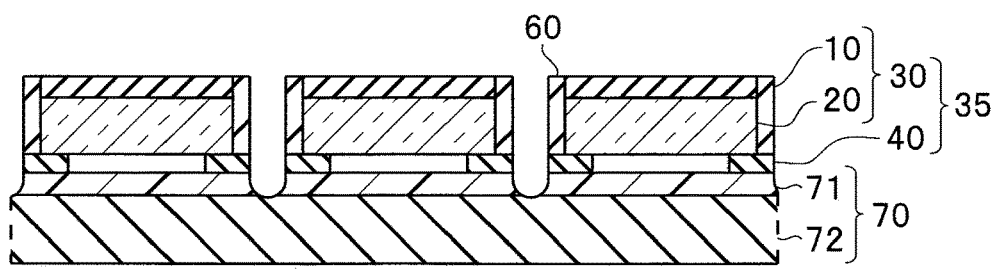
FIG. 8D is a sectional view for explaining the manufacturing method of the image pickup apparatus according to the first modification of the first embodiment.

As illustrated in FIG. 8D, the plurality of stacked bodies 35 integrated by the resin 60 are divided into individual pieces by cutting the resin 60.

Figure 8E:
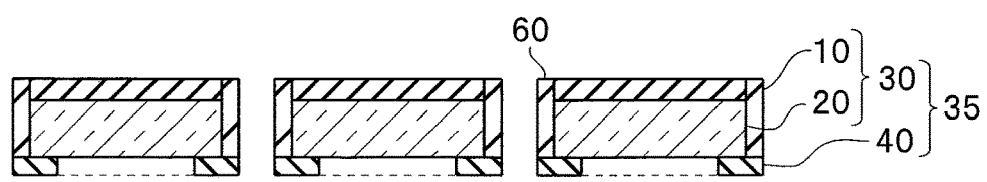
FIG. 8E is a sectional view for explaining the manufacturing method of the image pickup apparatus according to the first modification of the first embodiment.

As illustrated in FIG. 8E, the release layer 71 loses its adhesive force by being subjected to heating treatment, for example, which enables separation process for separating the stacked bodies 35 from the support plate 70 to be performed. The support plate 70 may be formed without the release layer 71, as long as the stacked bodies 35 can be easily separated.

Note that the separation process may be performed before the cutting process S80.

In the manufacturing method of the image pickup apparatus 9, the stacked bodies 35 are fabricated by stacking the image pickup members 30 respectively on the plurality of spacers 40 disposed on the principal surface 70SA of the support plate 70, which enables the easy fabrication of the plurality of stacked bodies 35. In addition, the plurality of image pickup members 30 which are being manufactured are integrated by the resin 60, which enables easy handling.

Second Modification of First Embodiment

Since an image pickup apparatus 9B and a manufacturing method of the image pickup apparatus 9B according to the present modification are similar to the image pickup apparatus 9A and the manufacturing method of the image pickup apparatus 9A, the constituent elements having the same functions as those in the image pickup apparatus 9A and the manufacturing method thereof are attached with the same reference numerals and descriptions thereof will be omitted.

Figure 9:
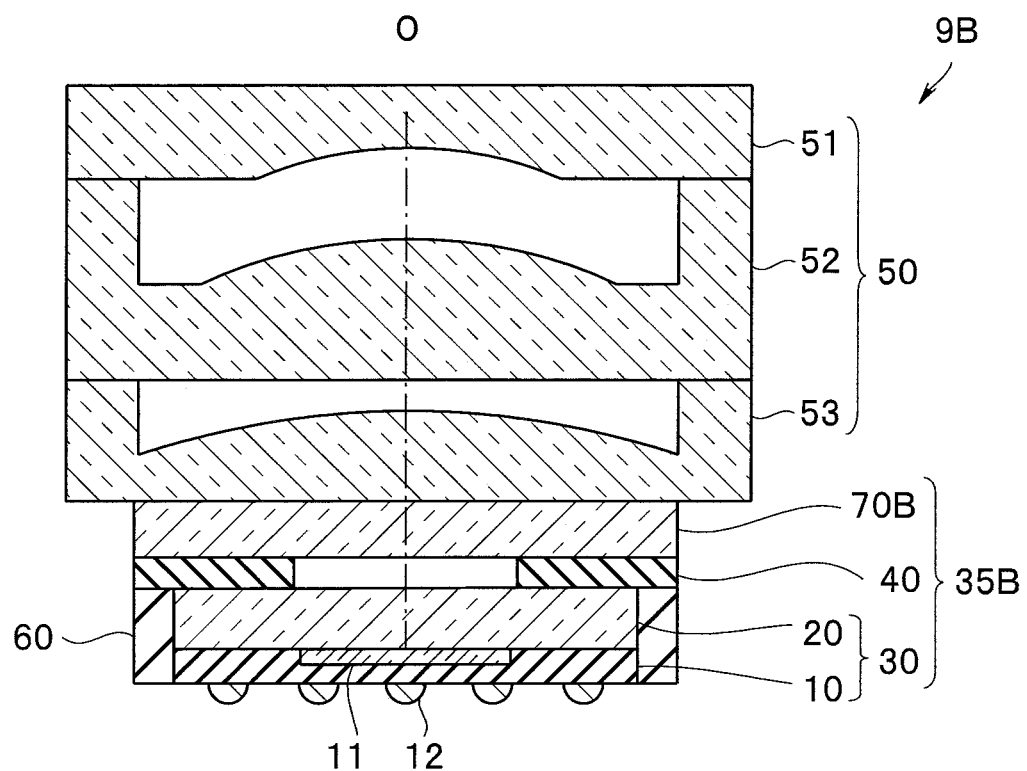
FIG. 9 is a sectional view of an image pickup apparatus according to a second modification of the first embodiment.

As illustrated in FIG. 9, in the image pickup apparatus 9B, a stacked body 35B includes a glass plate 70B which is a second transparent plate.

The glass plate 70B is included in the stacked body 35 in a state where the support plate cut in the cutting process S80 is not separated. The dimension of the glass plate 70B in the direction orthogonal to the optical axis is the same as those of the resin 60 and the spacer 40.

In other words, the separation process may be eliminated when the support plate 70 is a transparent plate such as a glass plate. In the manufacturing method of the image pickup apparatus 9B, the support plate 70 is also cut in the cutting process S80. The cut support plate 70 can be regarded as the glass plate 70B having the function as the spacer for adjusting the optical path length.

Note that it is needless to say that the glass plate 70B is regarded as a part of the spacer in the selection process S50. In other words, the sum of the thickness of the spacer 40 and the thickness of the glass plate 70B is regarded as the thickness D40 of the spacer.

Since the separation process is not necessary, the image pickup apparatus 9B can be manufactured more easily than the image pickup apparatus 9A.

Second Embodiment

Since an image pickup apparatus 9C and a manufacturing method of the image pickup apparatus 9C according to the present embodiment are similar to the image pickup apparatus 9 and the manufacturing method of the image pickup apparatus 9, the constituent elements having the same functions as those in the image pickup apparatus 9 and the manufacturing method thereof are attached with the same reference numerals and descriptions thereof will be omitted.

The image pickup apparatus 9C has the same configuration as the configuration of the image pickup apparatus 9 as illustrated in FIG. 1 and FIG. 2.

As already described, the optical members 50 fabricated by cutting the same stacked wafer have substantially the same focusing lengths L50. However, the optical members 50 fabricated by cutting different stacked wafers have sometimes different focusing lengths L50.

Figure 10:
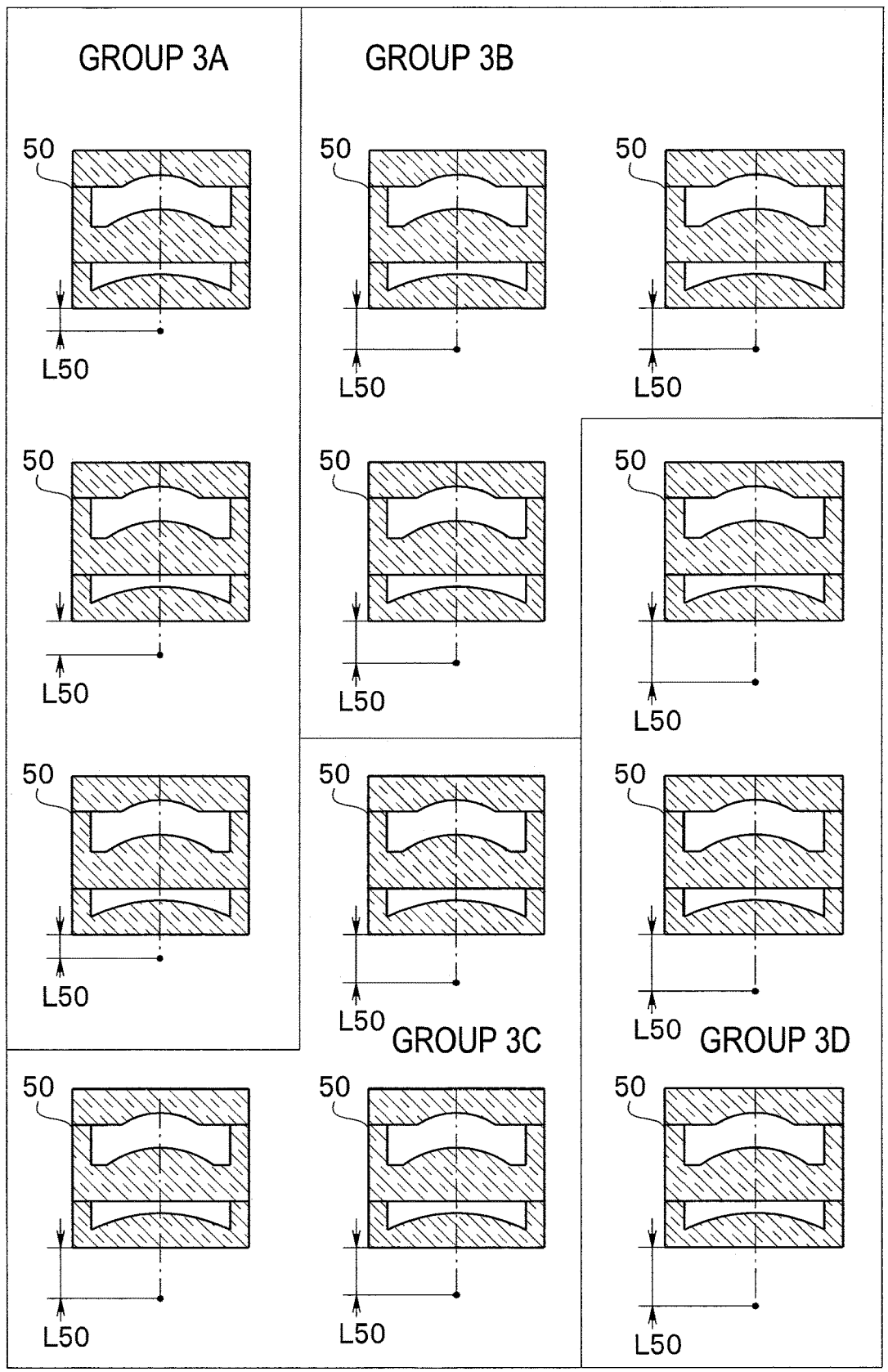
FIG. 10 is a view for explaining a third classification process in a manufacturing method of an image pickup apparatus according to a second embodiment.

The present manufacturing method, as illustrated in FIG. 10, further includes a third classification process (step S45: not illustrated). In the third classification process, the plurality of optical members 50 having different focusing lengths L50 are classified into a plurality of third groups 3A to 3D depending on the focusing lengths L50. The third classification process S45, the first classification process S30, and second classification process S40 may be performed in any order, or may be performed concurrently.

The focusing lengths L50 of the optical members 50 in the third groups 3A, 3B, 3C, and 3D are within the following ranges, for example.

The third group 3A; 360 $\mu m \leq L50 < 370$ $\mu m$
The third group 3B; 370 $\mu m \leq L50 < 380$ $\mu m$
The third group 3C; 380 $\mu m \leq L50 < 390$ $\mu m$
The third group 3D; 390 $\mu m \leq L50 < 400$ $\mu m$ In the selection process S50, a combination of any one of the plurality of first groups 1, any one of the plurality of second groups 2, and any one of the plurality of third groups 3 is selected such that the sum G becomes the focusing length L50 of any one of the optical members 50.

Then, in the stack process S60, the image pickup member 30 in the first group, the spacer 40 in the second group, and the optical member 50 in the third group, in the selected combination, are stacked.

Even in a case where the number of image pickup members 30 classified into the first group 1A is small, for example, if the sum G of the thickness of the image pickup member 30 in the first group 1 A and the thickness of the spacer 40 in the second group 2B is within the range of the focusing length L50 in any of the third groups 3A to 3D, an image pickup apparatus with desired optical characteristics can be fabricated. Thus, the manufacturing method of the image pickup apparatus 9C provides excellent manufacturing efficiency and reduced cost.

The number of groups in the third classification process is preferably 3 or more and 20 or less, although not specifically limited. If the number of groups is 3 or more, it is possible to easily fabricate the image pickup apparatus with desired optical characteristics. If the number of groups is 20 or less, the classifying work is easy. In addition, the number of groups in the first classification process S30, the number of groups in the second classification process S40, and the number of groups in the third classification process S45 may be different from one another.

Note that, needless to say, also in the manufacturing method of the image pickup apparatus 9C, the resin 60 may be disposed and cut similarly as in the image pickup apparatus 9A, and furthermore, the transparent plate may be used as the support plate similarly as in the image pickup apparatus 9B.

Each of the image pickup apparatuses 9 and 9A to 9C is ultra-small, with the light-receiving surface 10SA of 5 mm square or less, for example. By using such image pickup apparatuses in an endoscope, it is possible to provide a low-invasive endoscope that displays high-quality images. Note that the endoscope may be a rigid endoscope or a flexible endoscope, and may be adopted for a medical use or an industrial use.

The present invention is not limited to the above-described embodiments, but various changes, modifications, and the like are possible without changing the gist of the present invention.

What is claimed is:

1. A manufacturing method of an image pickup apparatus, the manufacturing method comprising:
    fabricating a plurality of image pickup members each including a light-receiving surface on which a transparent plate is disposed, and a plurality of spacers each configured to adjust an optical path length;
    measuring a thickness of each of the transparent plates and a thickness of each of the plurality of spacers;
    classifying the plurality of image pickup members into a plurality of first groups depending on the thickness of each of the transparent plates;
    classifying the plurality of spacers into a plurality of second groups depending on the thickness of each of the spacers;
    selecting a combination of any one of the plurality of first groups and any one of the plurality of second groups such that a sum of the thickness of each of the transparent plates and the thickness of each of the spacers is within a predetermined range with a focusing length of optical members as a center, the optical members each comprising an incident surface, an emission surface opposed to the incident surface, and a plurality of stacked optical elements, the focusing length being a length from the emission surface to a focusing surface of each of the optical members;
    fabricating stacked bodies, each of the stacked bodies being fabricated by stacking the image pickup member in the first group and the spacer in the second group in the selected combination; and
    disposing the optical members respectively on the spacers in the stacked bodies.

2. The manufacturing method, according to claim 1, further comprising, classifying the plurality of optical members, each having a different focusing length, into a plurality of third groups depending on the focusing length of each of the plurality of optical members, in addition to the classifying of the plurality of image pickup members into the first group and the classifying of the spacers into the second group,
    wherein, in the selecting of the combination, selecting a combination of any one of the plurality of first groups, any one of the plurality of second groups, and any one of the plurality of third groups such that the sum is within the predetermined range; and
    in the fabricating of the stacked bodies, fabricating each of the stacked bodies by stacking the image pickup member in the first group, the spacer in the second group, and the optical member in the third group, in the selected combination.

3. The manufacturing method according to claim 1, wherein
    in the fabricating of the plurality of spacers, disposing the plurality of spacers on a principal surface of a support plate; and
    in the fabricating of the stacked bodies, fabricating the stacked bodies by stacking the plurality of image pickup members in the selected combination on the plurality of spacers in the selected combination, the plurality of spacers being disposed on the principal surface of the support plate.

4. The manufacturing method according to claim 3, further comprising, after the fabricating of the stacked bodies,
    disposing a resin around the plurality of stacked bodies disposed on the principal surface of the support plate; and
    cutting the resin around the plurality of stacked bodies that are integrated.

5. The manufacturing method according to claim 4, wherein
    the support plate is a second transparent plate, and
    when the resin is cut, the support plate is also cut.

* * * * *